United States Patent
Wang

(10) Patent No.: US 11,227,433 B2
(45) Date of Patent: Jan. 18, 2022

(54) DEVICE AND METHOD FOR EXTRACTING TERRAIN BOUNDARY

(71) Applicant: BEIJING GOLDWIND SCIENCE & CREATION WINDPOWER EQUIPMENT CO., LTD., Beijing (CN)

(72) Inventor: Qiankun Wang, Beijing (CN)

(73) Assignee: BEIJING GOLDWIND SCIENCE & CREATION WINDPOWER EQUIPMENT CO., LTD., Beijing (CN)

( * ) Notice: Subject to any disclaimer, the term of this patent is extended or adjusted under 35 U.S.C. 154(b) by 625 days.

(21) Appl. No.: 16/092,125

(22) PCT Filed: Mar. 8, 2018

(86) PCT No.: PCT/CN2018/078435
§ 371 (c)(1),
(2) Date: Oct. 8, 2018

(87) PCT Pub. No.: WO2019/019653
PCT Pub. Date: Jan. 31, 2019

(65) Prior Publication Data
US 2021/0217234 A1 Jul. 15, 2021

(30) Foreign Application Priority Data
Jul. 28, 2017 (CN) .......................... 201710628165.7

(51) Int. Cl.
*G06T 17/05* (2011.01)
*G06T 7/564* (2017.01)
(Continued)

(52) U.S. Cl.
CPC .............. *G06T 17/05* (2013.01); *G06T 7/149* (2017.01); *G06T 7/564* (2017.01); *G06T 15/005* (2013.01); *G06T 19/00* (2013.01)

(58) Field of Classification Search
CPC .......... G06T 17/05; G06T 7/564; G06T 7/149
See application file for complete search history.

(56) References Cited

U.S. PATENT DOCUMENTS

2016/0180586 A1 6/2016 Marks et al.

FOREIGN PATENT DOCUMENTS

| CN | 101398943 A | 4/2009 |
|----|-------------|--------|
| CN | 101551828 A | 10/2009 |

(Continued)

OTHER PUBLICATIONS

Zhao, X., Guo, Q., Su, Y. and Xue, B., 2016. Improved progressive TIN densification filtering algorithm for airborne LiDAR data in forested areas. ISPRS Journal of Photogrammetry and Remote Sensing, 117, pp. 79-91.*

(Continued)

*Primary Examiner* — Zhitong Chen

(57) ABSTRACT

Provided are a device and a method for extracting a terrain boundary, including: a grid creating module configured to divide a region which is determined based on measured contour line data of a target terrain, to form a regular grid including multiple grid units; a data analyzing module configured to assign a first standard value or a second standard value to each of the multiple grid units based on the number of elevation points included in the grid unit, to form a final grid region, where the final grid region is a region including all grid units having the first standard value; and a boundary extracting module configured to extract a terrain boundary based on the final grid region.

20 Claims, 5 Drawing Sheets

(51) Int. Cl.
    *G06T 7/149*     (2017.01)
    *G06T 19/00*     (2011.01)
    *G06T 15/00*     (2011.01)

(56) References Cited

FOREIGN PATENT DOCUMENTS

| | | | | |
|---|---|---|---|---|
| CN | 102339478 | A | 2/2012 | |
| CN | 102339478 | B * | 11/2013 | ............... G06K 9/54 |
| CN | 104537717 | A | 4/2015 | |
| CN | 104637075 | A | 5/2015 | |
| CN | 103927543 | B * | 12/2015 | ............. G06T 17/05 |
| CN | 107393002 | A | 11/2017 | |
| JP | 2012-141833 | A | 7/2012 | |

OTHER PUBLICATIONS

Honglei Zhu, et al; "Triangulated irregular network optimization from contour data using bridge and tunnel edge removal", International Journal of Geographical Information Science, 18 pages; Published online Aug. 6, 2010.

Extended European Search Report dated Mar. 21, 2019; Appln. No. 18785239.7.

The International Search Report dated Jun. 8, 2018; PCT/CN2018/078435.

* cited by examiner

| Starting longitude | Starting latitude | Longitude difference of a grid unit | Latitude difference of a grid unit | The number of rows | The number of columns |
|---|---|---|---|---|---|
| sLon | sLat | gapLon | gapLat | Row | Col |

| [Colc-1, ROWc-1] | [Colc, ROWc-1] | [Colc+1, ROWc-1] |
|---|---|---|
| [Colc-1, ROWc] | [Colc, ROWc] | [Colc+1, ROWc] |
| [Colc-1, ROWc+1] | [Colc, ROWc+1] | [Colc+1, ROWc+1] |

Figure 4

DEVICE AND METHOD FOR EXTRACTING TERRAIN BOUNDARY

CROSS-REFERENCE TO RELATED APPLICATIONS

The present application is a national phase of international application No. PCT/CN2018/078435 filed on Mar. 8, 2018, which claims the benefit of priority to Chinese Patent Application No. 201710628165.7, titled "DEVICE AND METHOD FOR EXTRACTING TERRAIN BOUNDARY", filed on 28 Jul. 2017 with the State Intellectual Property Office of People's Republic of China, both of which are incorporated herein by reference in their entirety.

FIELD

The present disclosure relates to the technical field of wind power generation, and in particular to a device and a method for extracting a terrain boundary.

BACKGROUND

In wind power industry, measured contour line data of a terrain of a wind farm is processed to obtain a region range of the wind farm in performing a micro-siting for a wind farm. In conventional geographic information software, a triangulated irregular network (TIN) has to be established first based on the contour line data, and then a minimum constraint side length of the TIN is set, at last an accurate outer contour of the wind farm can be extracted. For a wind farm including multiple separated regions, an outer contour of each of the regions is extracted separately. It is impossible to automatically provide an outer contour of a discontinuous region.

SUMMARY

A device for extracting a terrain boundary is provided in an aspect of the present disclosure, which may include: a grid creating module configured to divide a region to form a regular grid including multiple grid units, where the region is determined based on measured contour line data of a target terrain; a data analyzing module configured to assign a first standard value or a second standard value to each of the multiple grid units based on the number of elevation points included in the grid unit, to form a final grid region, where the final grid region is a region including all grid units having the first standard value; and a boundary extracting module configured to extract a terrain boundary based on the final grid region.

A method for extracting a terrain boundary is provided in another aspect of the present disclosure, which may include: dividing a region d to form a regular grid including multiple grid units, where the region is determined based on measured contour line data of a target terrain; assigning a first standard value or a second standard value to each of the multiple grid units based on the number of elevation points included in the grid unit, to form a final grid region, where the final grid region is a region including all grid units having the first standard value; and extracting a terrain boundary based on the final grid region.

A computer readable memory medium in which a computer program is stored is provided in a third aspect of the present disclosure. The computer program is for executing the method for extracting a terrain boundary described above.

A computer in which a computer program is stored is provided in a fourth aspect of the present disclosure. The computer program is for executing the method for extracting a terrain boundary described above.

With the device and the method for extracting the terrain boundary described above, contour line data of the terrain is analyzed and spatial elevation point data is then obtained. A relation between a point and a plane can only be classified into two relations, i.e., a relation that the point is included in the plane and a relation that the point is not included in the plane. Compared with a relation between a line and a plane, the relation between a point and a plane is simpler, which can facilitate data storage and analysis. According to the device and the method, space is divided to form a regular gird including multiple grid units in extracting the terrain boundary. When compared with the triangulated irregular network TIN and vector data, the grid data is clear in positioning. A spatial position may be determined directly based on a row and a column of the grid unit located in a whole region, which facilitates search operations and an overlay analysis. By establishing a relation between an elevation point and a spatial grid, a distribution feature of the elevation point in the spatial region may be determined rapidly. A distribution of elevation points at a specific position may be extracted, and attribution information of the spatial grid may be modified. In addition, according to the device and the method, a grid unit having elevation point data may be excluded rapidly by traversing the grid units. A TIN model is established for a grid unit having no elevation point data selectively, thereby reducing the number of constructing a TIN model and the number of elevation points for the constructing of the TIN model, and improving an operation efficiency.

BRIEF DESCRIPTION OF THE DRAWINGS

The embodiments of the present disclosure are described in detail in conjunction with the drawings, to make those skilled in the art fully understand the present disclosure, in the drawings:

FIG. 4 is a schematic diagram showing an example of a window indexer according to an embodiment of the present disclosure

DETAILED DESCRIPTION OF THE EMBODIMENTS

The embodiments of the present disclosure are described in detail with reference to the drawings hereinafter.

Figures 1, 2:
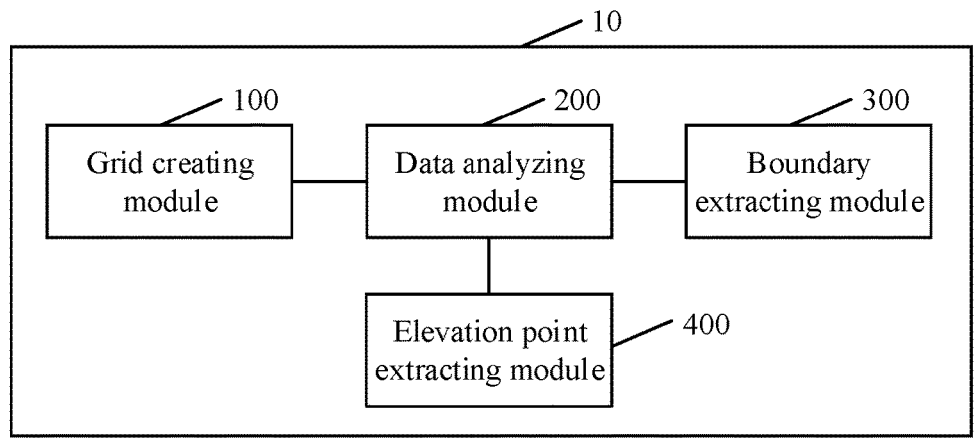
FIG. 1 is a block diagram of a device for extracting a terrain boundary according to an embodiment of the present disclosure.
FIG. 2 is a schematic diagram showing basic information of a regular grid according to an embodiment of the present disclosure.

FIG. 1 is a block diagram of a device for extracting a terrain boundary according to an embodiment of the present disclosure.

As shown in FIG. 1, the device may include a grid creating module 100, a data analyzing module 200 and a boundary extracting module 300.

The grid creating module 100 is configured to divide a region, which is determined based on measured contour line data of a target terrain, to form a regular grid including multiple grid units, so that a rapid data retrieving and positioning may be realized. The measured contour line data may be measured contour line data of a terrain provided by a user. In some embodiments of the present disclosure, the measured contour line data may be vector data in a dxf format, a shp format or other format provided by the user.

The grid creating module 100 may determine a bounding rectangle of contour lines, which are determined based on the measured contour line data, as the region. That is, the grid creating module 100 determines all contour lines corresponding to the measured contour line data based on the measured contour line data, and determines a bounding rectangle of the all contour line as the region. Therefore, by the above operation performed by the grid creating module 100 in the present disclosure, in a case that there are multiple wind farms, the multiple wind farms can be connected to form a large region (that is, a bounding rectangle region for all of the measured contour line data) as a single input, so that an outer contour is provided automatically for a continuous region.

In addition, the grid creating module 100 may determine a density of the contour lines based on the measured contour line data, and determine a size of a grid unit based on the density of contour lines, and divide the region, which is determined based on the bounding rectangle, into multiple grid units based on the grid unit with the determined size, to form the regular grid including multiple grid units. In some embodiments of the present disclosure, in a case that a region, which is determined based on the bounding rectangle of all of the contour lines, has a length of 900 m and a width of 900 m, and a distance between two adjacent contour lines is 2 m, the grid creating module 100 may determine a size of a grid unit as 30 m×30 m, that is, a ratio of the length or the width of the grid unit to the distance is 15:1. Based on this, the grid creating module 100 may divide the region into grid units with the same size as the grid unit with the size of 30 m×30 m, to form a regular grid including ninety grid units with the size of 30 m×30 m.

In the above example, the length and the width of the region, which is determined based on the bounding rectangle, are integral multiples of a length and a width of the grid unit, respectively. In this case, the regular grid, which is formed by the multiple grid units that are dividing from the region, has the same size as the region. In a case that the length and the width of the region, which is determined based on the bounding rectangle, are not integral multiples of the length and the width of the grid unit, respectively, the length and the width of the region may be extended to be integral multiples of the length and the width of the grid unit, respectively based on the length and the width of the grid unit. In some embodiments of the present disclosure, in a case that a length and a width of the region is 1000 m and 800 m respectively and a length and a width of the grid unit is 30 m and 30 m respectively, the length and the width of the region may be extended to 1020 m and 810 m respectively. The extended region is divided into multiple grid units based on the grid unit, to form a regular grid including the multiple grid units. In this case, the size of the regular grid is greater than the size of the region which is determined based on the bounding rectangle. In addition, in the case that the length and the width of the region determined based on the bounding rectangle are not integral multiples of the length and the width of the grid unit respectively, the length and the width of the region may be reduced to integral multiples of the length and the width of the grid unit respectively, based on the length and the width of the grid unit. In some embodiments of the present disclosure, in a case that the length and the width of the region is 1000 m and 800 m respectively, and the length and the width of the grid unit is 30 m and 30 m respectively, the length and the width of the region may be reduced to 990 and 780 m respectively. The reduced region is divided into multiple grid units based the one grid unit, to form a regular grid including the multiple grid units. In this case, the size of the regular grid is less than the size of the region which is determined based on the bounding rectangle.

The grid creating module 100 may store grid information of the regular grid in a format shown in FIG. 2, where sLon denotes starting longitude, sLat denotes starting latitude, gapLon denotes a longitude difference of a grid unit (that is, a longitude difference between two opposite sides of a grid unit in a latitude direction), gapLat denotes a latitude difference of a grid unit (that is, a latitude difference between two opposite sides of a grid unit in a longitude direction), Row denotes the number of rows of the grid units included in the regular grid, and Col denotes the number of columns of the grid units included in the regular grid.

As shown in FIG. 1, the device 10 may further include an elevation point extracting module 400. The elevation point extracting module 400 may extract an elevation points based on the measured contour line data and store information of the extracted elevation point. The information on the extracted elevation point includes longitude, latitude and an elevation value of the elevation point, which may facilitate a further overlay with the grid unit in subsequent processing. The elevation point extracting module may extract a set of elevation points from vector data, which is regards as the measured contour line data, by using related tools in the tool kit of multiple conventional geographic information software (for example, Aregis, GDAL and the like).

Specifically, the elevation point extracting module 400 may analyze the measured contour line data provided by the user, and extract a set of elevation points for constructing the contour lines, so as to obtain all elevation points in the whole region, and store each of the elevation points as an object Point[x, y, z], where x denotes longitude of an elevation point, y denotes latitude of the elevation pint and z denotes an elevation value of the elevation point.

The data analyzing module 200 may assign a first standard value or a second standard value to each of the grid units based on the number of elevation points included in the grid unit, to form a final grid region. The final grid region is a region including all grid units having the first standard value. The first standard value may be any value, and the second standard value may be any value other than the first standard value. In some embodiments of the present disclosure, the second standard value may be zero in a case that the first standard value is 100.

In forming the final grid region, the data analyzing module 200 may assign a first standard value to each of the grid units in which the number of elevation points is not zero. The data analyzing module 200 assigns a first standard value or a second standard value to each of the grid units that include no elevation point, based on an elevation point included in the predetermined number of grid units that are close to the grid unit that includes no elevation point. In specific, for each grid unit in which the number of elevation points is zero, the data analyzing module 200 may construct a triangulated irregular network model based on the elevation point in the predetermined number of grid unis that are close to the grid unit in which the number of elevation points is zero, and assign a first standard value to the grid unit in a case that the triangulated irregular network model meets a predetermined condition, and assign a second standard value to the grid unit in a case that the triangulated irregular network model does not meet the predetermined condition.

Before determining whether the number of elevation points included in each of the multiple grid units in the regular grid is zero, the data analyzing module 200 may traverse multiple elevation points, which are extracted based on the measured contour line data, to establish and store a spatial index relation between each of the multiple elevation points and the grid units in the regular grid, details of which is described with reference to FIG. 3.

Figure 3:
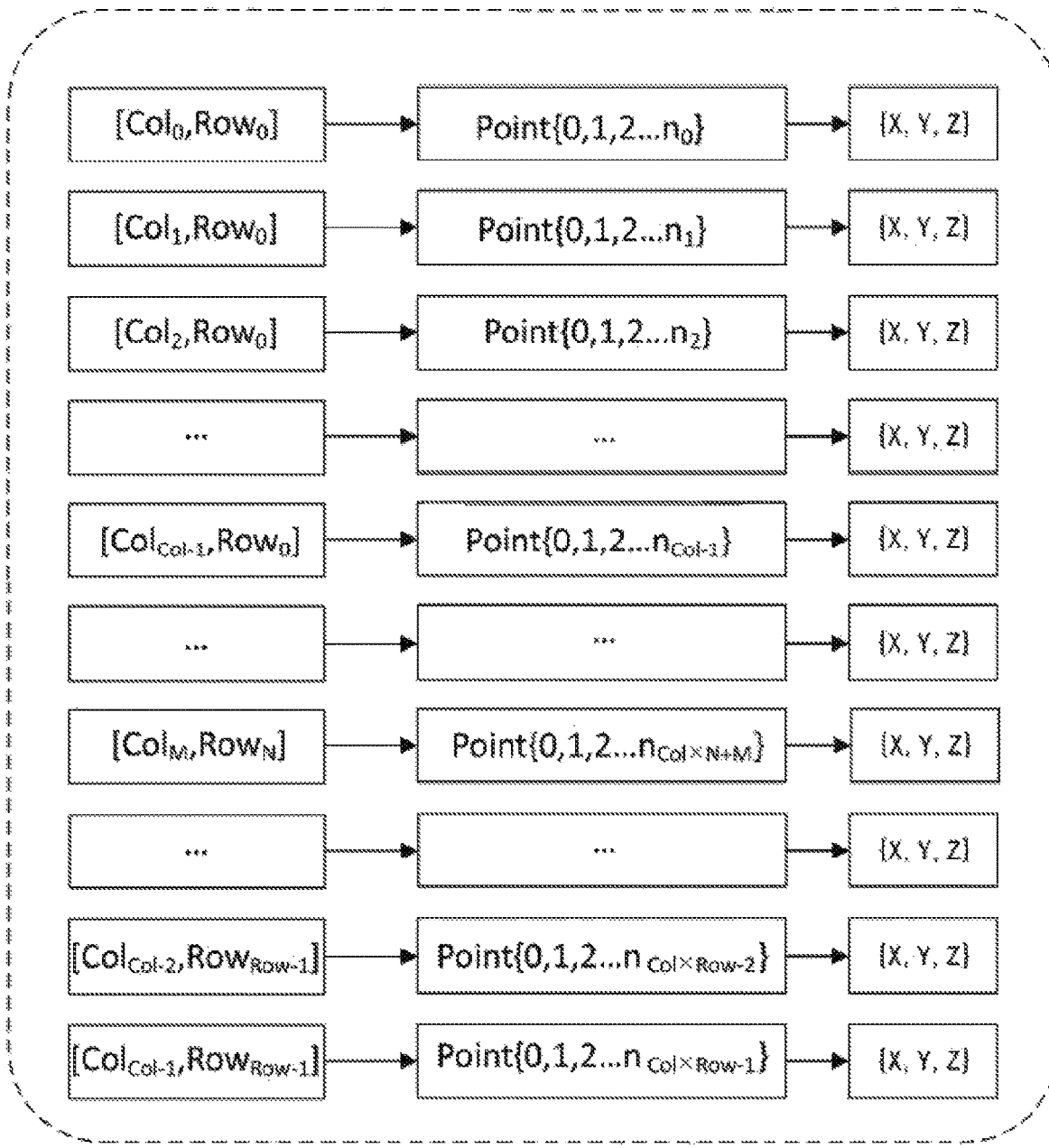
FIG. 3 is a schematic diagram showing a spatial storage structure for a set of elevation point data of a regular grid according to an embodiment of the present disclosure.

FIG. 3 is a schematic diagram showing a spatial storage structure for a set of elevation point data of the regular gird according to an embodiment of the present disclosure. The data analyzing module 200 calculate a position of the grid unit, where each of multiple elevation points is located, in the regular grid based on the grid information of the regular grid, so as to establish and store the spatial index relation.

Specifically, the data analyzing module 200 calculates a position of the grid unit, where each of multiple elevation points is located, in the regular grid based on the grid information of the regular grid according to the following equations (1), (2) and (3).

$$dTem = gapLon * gapLat \quad (1)$$

$$dCol = \text{int}\{(gapLat*(x-sLon))/dTem+0.5\} \quad (2)$$

$$dRow = \text{int}\{(gapLon*(sLat-y))/dTem+0.5\} \quad (3)$$

where dTem denotes a longitude and latitude range of a grid unit, dCol denotes a column number of a position for a grid unit having longitude of x and latitude of y in the regular grid, dRow denotes a row number of a position for a grid unit having longitude of x and latitude of y in the regular grid, int{ } denotes a rounding function, and gapLon, gapLat, sLon and sLat denote the same meaning as those in FIG. 2, and thus are not described herein anymore.

The data analyzing module 200 constructs the regular grid as an array Array{Row*Col}, where Row*Col denotes a size of the array. Information of a grid unit at a N-th row and an M-th column of the regular grid (that is, a row and a column of the grid unit in the regular grid) and information of an elevation point in the grid unit (that is, longitude, latitude and an elevation value of the elevation point) are stored at a position of Array[Row*N+M] in the array Array, where N and M are integers greater than or equal to zero. An elevation point array including n elevation points is stored at the position of Array[Row*N+M] in the array Array [Row*Col] of the regular grid, where n>0. The size of the elevation point array is n. An i-th elevation point is Point=Array[Row*N+M][i], where i denotes a position of the elevation point in the elevation point array. By the above process, the data analyzing module 200 realizes an index processing from a whole regular grid to a grid unit, and then to an elevation point, so that a spatial index relation between an elevation point and a grid unit in the regular grid is established.

In FIG. 3, a grid unit at a N-th row and an M-th column corresponds to an elevation point array Point{0, 1, 2 . . . $n_{Col \times N+M}$}, where N and $n_{Col \times N+M}$ are integers greater than or equal to 0. Information of each of the elevation points in the elevation point array Point{0, 1, 2 . . . $n_{Col \times N+M}$} is {x, y, z}, where x denotes longitude of the elevation point, y denotes latitude of the elevation point, and z denotes an elevation value of the elevation point.

In addition, based on a result of the determining whether the number of elevation points included in each of the multiple grid units in the regular grid is zero, the data analyzing unit 200 may determine that the grid unit that includes at least one elevation point is located in a region range of a wind farm in a case that the number of elevation points included in the grid unit is not zero, and assign a first standard value to the grid unit that includes at least one elevation point.

In a case that the number of elevation points included in the grid unit is zero, the data analyzing unit 200 may acquire a predetermined number of grid units which are close to the grid unit that includes no elevation point through a window indexer using the spatial index relation which is determined above, and construct a triangulated irregular network model based on the elevation points in the predetermined number of grid units. This is described in detail with reference to FIG. 4 hereinafter.

Specifically, since distribution densities of spatial elevation points are different in different space, the number of elevation points included in one grid unit is uncertain, there may be a case that a grid unit (which is referred to as a "to-be-determined grid unit" hereinafter) is located in the region range of the wind farm but include no elevation point. Regarding this case, whether the to-be-determined grid unit is located in the region range of the wind farm is determined based on an elevation point included in a surrounding grid units that are close to the to-be-determined grid unit, and based on which information of a central point of the to-be-determined grid unit is extracted and inserted. Since the elevation point in the surrounding grid unit will have a reduced influence on elevation information of the to-be-determined grid unit if a distance between the surrounding gird unit and the to-be-determined grid unit is increased, the number of elevation points in the surrounding grid units, which is in a search range, may be not enough in a case that the search range for the surrounding grid unit is too small. Therefore, the to-be-determined grid unit may be determined to be located outside the region range of the wind farm incorrectly. In a case that the search range is too large, a grid unit which is actually located outside of the region range of the wind farm may be determined to be located in the region range of the wind farm incorrectly. Therefore, the data analyzing module 200 determine a window size of the window indexer based on a distance between contour lines, where the distance is determined by analyzing the measured contour line data of the target terrain.

FIG. 4 is a schematic diagram showing an example of a window indexer according to an embodiment of the present disclosure. As shown in FIG. 4, a grid unit at a center position [$Col_c$, $Row_c$] of the window indexer is the to-be-determined grid unit. The to-be-determined grid unit is located at a $Col_c$-th column and a $Row_c$-th row of the regular grid. The data analyzing module 200 may acquire row and column information of eight grid units (that is, a grid unit above the to-be-determined grid unit, a grid unit below the to-be-determined grid unit, a grid unit on the left of the to-be-determined grid unit, a grid unit on the right of the to-be-determined grid unit, a grid unit on the upper left of the to-be-determined grid unit, a grid unit on the bottom left of the to-be-determined grid unit, a grid unit on the upper right of the to-be-determined grid unit and a grid unit on the bottom right of the to-be-determined grid unit) surrounding the to-be-determined grid unit quickly by overlapping using a window indexer with a window size of 3×3 grid units. The data analyzing module 200 then extracts elevation points in the eight grid units, and construct a triangulated irregular model using the extracted elevation points. The window indexer shown in FIG. 4 is only an example, and a window indexer may also be other window size according to the present disclosure. In some embodiments of the present disclosure, a cross-shaped window indexer which takes the to-be-determined grid unit as a center is adopted, that is, the window indexer may acquire row and column information of four grid units that is above the to-be-determined grid unit, below the to-be-determined grid unit, on the left of the to-be-determined grid unit and on the right of the to-be-determined grid unit respectively by overlapping.

In constructing the triangulated irregular network model, the data analyzing module 200 constructs a triangulated irregular network model using all elevation points in the predetermined number of grid units in a case that the number of the elevation points included in the predetermined number of grid units is greater than or equal to 3. The data analyzing module 200 assigns a second standard value to a current grid unit that includes no elevation point (that is, a grid unit located at a central position of the window indexer) in a case that the total number is less than 3. Since at least three elevation points are required in constructing the triangulated irregular network model, the data analyzing unit 200 determines that it is unable to construct the triangulated irregular network model, and further determines that the current grid unit is located outside the region range of the wind farm, in a case that the total number of the elevation points included in the predetermined number of grid units is less than three.

After the triangulated irregular network model is constructed by the data analyzing module 200 using all elevation points in the predetermined number of grid units, the data analyzing module 200 may determine that the triangulated irregular network model meets the predetermined condition in a case that a central point of the current grid unit is located inside the triangulated irregular network model. This indicates that the current grid unit is located in the region range of the wind farm, so that the data analyzing module 200 may assign a first standard value to the current grid unit. In addition, the data analyzing module 200 may calculate an elevation value at a central point of the current grid unit using elevation values of all elevation points included in the predetermined number of grid units by adopting various methods. In some embodiments of the present disclosure, the data analyzing module 200 may perform interpolation on elevation values of all of the elevation points included in the predetermined number of grid units, to calculate the elevation value at the central point. In some embodiments of the present disclosure, the data analyzing module 200 may calculate an average for the elevation values of all of the elevation points included in the predetermined number of grid units, to calculate the elevation value at the central point. The data analyzing module 200 may determine that the triangulated irregular network model does not meet the predetermined condition in a case that the central point of the current grid unit is located outside the triangulated irregular network model. This indicates that the current grid unit is located outside the region range of the wind farm, so that the data analyzing module 200 may assign a second standard value to the current grid unit. According to the present disclosure, a triangulated irregular network model is constructed only for the grid unit that includes no elevation point by using the elevation points included in a predetermined number of grid units which surround the grid unit, so as to rapidly and accurately determine whether the grid unit is in a boundary region. An issue in the conventional technology that an accurate outer contour of the wind farm is extracted by a complicated process, which includes establishing a triangulated irregular network model based on the contour line data and setting a minimum constraint side length of the triangulated network, is therefore addressed.

The data analyzing module 200 traverses all grid units in the regular grid through the above operation, to obtain a final grid region.

The boundary extracting module 300 may extract a terrain boundary based on the acquired final grid region.

The boundary extracting module 300 may directly extract a vector boundary of data from the acquired final grid region based on a conversion principle of geographic information technology that is between a grid and a vector plane and by using various conventional data conversion algorithm, for example, a gdal switch data conversion algorithm. A buffer analysis is then performed on the vector boundary of data to extract a terrain boundary.

Figure 5:
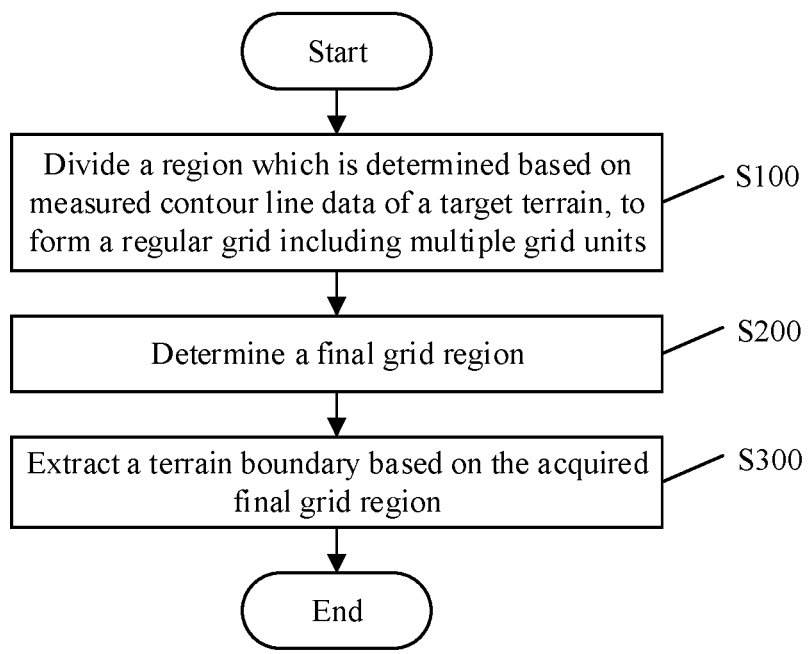
FIG. 5 is a flow diagram of a method for extracting a terrain boundary according to an embodiment of the present disclosure.

FIG. 5 is a flow diagram of a method for extracting a terrain boundary according to an embodiment of the present disclosure.

Reference is made to FIG. 5, which includes steps S100 to S300. In step S100, a region, which is determined based on measured contour line data of a target terrain, is divided to form a regular grid including multiple grid units. The measured contour line data may be measured contour line data of a terrain provided by a user. In some embodiments of the present disclosure, the measured contour line data may be vector data in a dxf format, a shp format or other format provided by the user.

The step of dividing a region, which is determined based on measured contour line data of a target terrain, to form a regular grid including multiple grid units may include: determining a bounding rectangle of all contour lines, which are determined based on the measured contour line data, as the region.

In addition, the step of dividing a region, which is determined based on measured contour line data of a target terrain, to form a regular grid including multiple grid units may further include: determining a density of the contour lines based on the measured contour line data, and determining a size of a grid unit based on the density of contour lines, and dividing the region into multiple grid units with the same size as the grid unit with the determined size, to form a regular grid including the multiple grid units.

Although not shown in FIG. 5, it should be understood that an elevation point may be extracted based on the measured contour line data, and information of the extracted elevation point is stored. The information of the extracted elevation point includes longitude, latitude and an elevation value of the elevation point. In addition, multiple elevation points extracted based on the measured contour line data may be traversed, and a spatial index relation between each of the multiple elevation points and the grid units in the regular grid is established and stored. The step of establishing and storing the spatial index relation between each of the multiple elevation points and the grid units in the regular grid may include: calculating a position of the grid unit, where each of the multiple elevation points is located, in the regular grid based on grid information of the regular grid, to establish and store the spatial index relation. This is described in detail above with reference to FIG. 1, and thus is not described herein anymore.

In step S200, a first standard value or a second standard value may be assigned to each of the grid units based on the number of elevation point included in the grid unit, to form a final grid region. The final grid region is a region including all grid units having a first standard value. The step of assigning a first standard value or a second standard value to each of the grid units based on the number of elevation points in the grid unit to form a final grid region may include: determining whether the number of elevation points included in each of the multiple grid units is zero, assigning a first standard value to each of the grid units that include at least one elevation point, and performing following operation on each of the grid units that include no elevation point. A first standard value or a second standard value is assigned to each of the grid units that include no elevation point based on an elevation point included in a predetermined number of grid units which are close to the grid unit that includes no elevation point.

The first standard value or the second standard value is assigned to each of the grid units that include no elevation point through the following operation. A triangulated irregular network model is constructed using all elevation points in the predetermined number of grid units which are close to the grid unit that includes no elevation point, and the first standard value is assigned to the grid unit that includes no elevation point in a case that the triangulated irregular network model meets a predetermined condition, and the second standard value is assigned to the grid unit that includes no elevation point in a case that the triangulated irregular network model does not meet the predetermined condition. Hereinafter, step S200 is described in detail with reference to FIG. 6.

Figure 6:
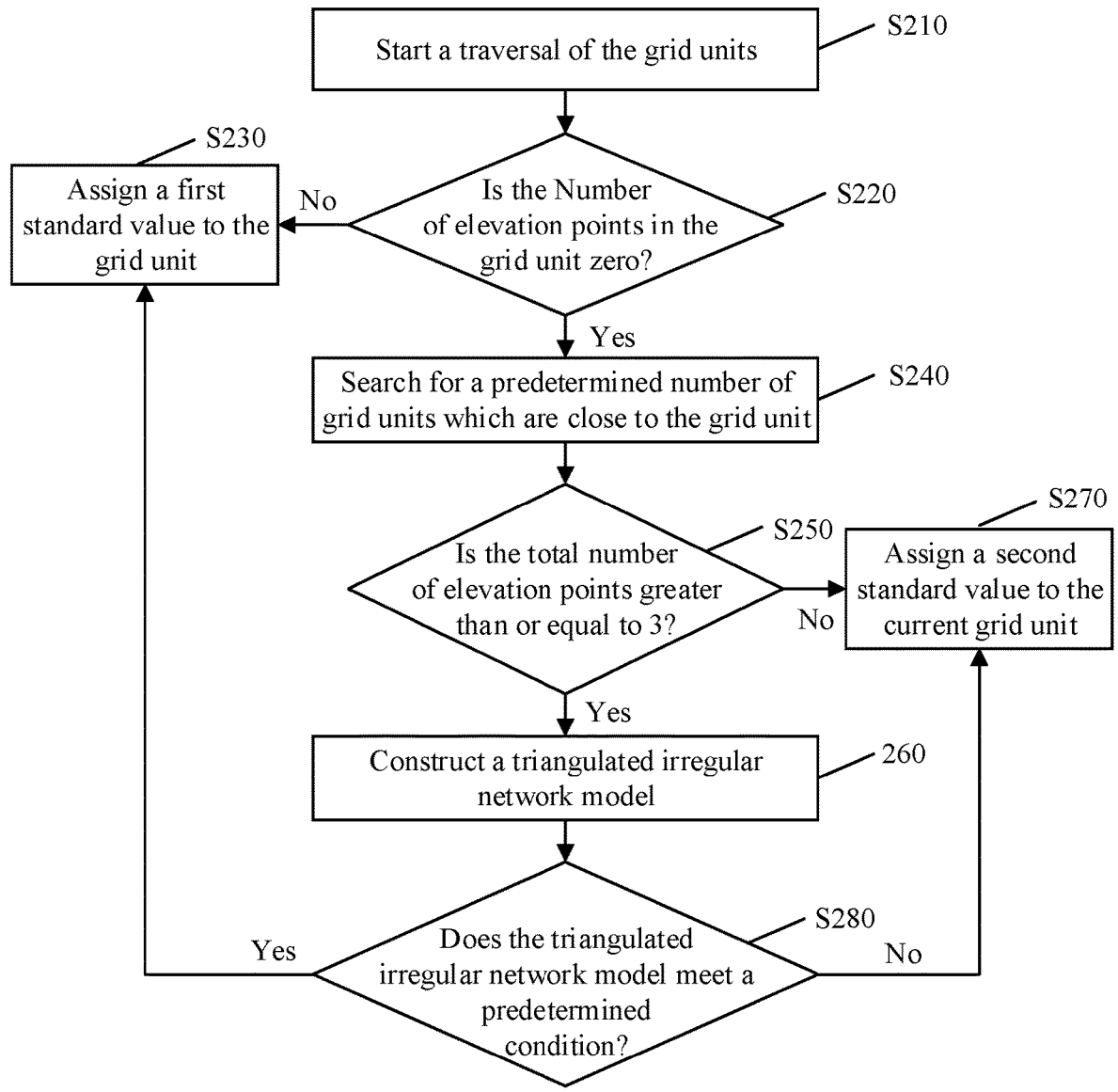
FIG. 6 is a flow diagram of performing data analysis on a grid unit according to an embodiment of the present disclosure.

FIG. 6 is a detailed flow diagram of performing data analysis on a grid unit according to an embodiment of the present disclosure, including steps S210 to S280. Since the same processing is performed on all grid units in the regular grid according to the method shown in FIG. 5, description only for one of the grid units is provided with reference to FIG. 6 hereinafter.

In step S210, one of the multiple grid units is traversed, and the process goes to step S220.

In step S220, whether the number of elevation points included in the one grid unit of the multiple grid units is zero is determined.

In a case that it is determined in step S220 that the number of elevation points included in the one grid unit is not zero, which indicates that the one grid unit is located in a region range of the wind farm, the process goes to step S230. In step S230, a first standard value is assigned to the one grid unit that includes at least one elevation point. The first standard value may be any value. In some embodiments of the present disclosure, the first standard value may be 100, and the present disclosure is not limited thereto.

In a case that it is determined in step S220 that the number of elevation points in the one grid unit is equal to zero, the process goes to step S240. In step S240, a predetermined number of grid units which are close to the one grid unit are searched for through a window indexer by using the spatial index relation, and a triangulated irregular network model is constructed by using elevation points in the predetermined number of grid units. Since at least three elevation points are required for constructing the triangulated irregular network model, the data analyzing unit 200 cannot construct the triangulated irregular network model in a case that the total number of the elevation points included in the predetermined number of grid units is less than 3. After the predetermined number of grid units are searched for through the window indexer by using the spatial index relation in step S240, the process goes to step S250.

In step S250, whether the total number of the elevation points included in the predetermined number of grid units is greater than or equal to three is determined.

In a case that it is determined in step S250 that the total number is less than 3, the process goes to step S270. In step S270, the second standard value is assigned to the one grid unit. The second standard value may be any value other than the first standard value. In some embodiments of the present disclosure, the second standard value may be zero in a case that the first standard value is 100, however, the present disclosure is not limited thereto.

In a case that it is determined in step S250 that the total number is greater than or equal to 3, the process goes to step S260. In step S260, a triangulated irregular network model is constructed by using all of the elevation points in the predetermined number of grid units, and then the process goes to step S280.

In step S280, whether the triangulated irregular network model meets a predetermined condition is determined, that is, whether a central point of the one grid unit is located in the triangulated irregular network model is determined.

In a case that it is determined in step S280 that the triangulated irregular network model meets the predetermined condition, that is, in a case that it is determined that the central point of the one grid unit is located in the triangulated irregular network model, it indicates that the one grid unit is in a region range of the wind farm, and the process goes to step S230. In step S230, the first standard value is assigned to the one grid unit.

In a case that it is determined in step S280 that the triangulated irregular network model does not meet the predetermined condition, that is, it is determined that the central point of the one grid unit is located outside the triangulated irregular network model, it indicates that the one grid unit is located outside the region range of the wind farm, and the process goes to step S270. In step S270, the second standard value is assigned to the one grid unit.

The process of performing data analysis on the grid unit shown in FIG. 6 is performed on each of all grid units included in the regular grid, to obtain a final grid region.

Reference is made to FIG. 5 again, in step S300, a terrain boundary is extracted based on the final grid region. A vector boundary of data in the final grid region is extracted directly from the acquired final grid region based on a conversion principle of geographic information technology which is between a grid and a vector plane and by using various conventional data conversion algorithm (the gdal switch data conversion algorithm in some embodiments of this disclosure). A buffer analysis is then performed on the vector boundary of data to extract a terrain boundary that is, to extract a region range of the wind farm.

In addition, a computer readable memory medium in which a computer program is stored is further provided according to the present disclosure. The computer program may be for executing the above method for extracting a terrain boundary. The computer program may be for executing the method including steps described with reference to FIG. 5 and FIG. 6.

In addition, a computer including a readable memory medium on which a computer program is stored is further provided according to the present disclosure. The computer program may be for executing the above method for extracting a terrain boundary. The computer program may be for executing the method including steps described with reference to FIG. 5 and FIG. 6.

Based on the device and the method for extracting a terrain boundary described above, a region range of a measured terrain map for a region of a wind farm is acquired automatically based on contour line data (a dxf file) of the measured terrain map. In addition, according to the device and the method, inputted contour line data of terrain is analyzed to acquire a set of elevation point data in the region range, and a bounding region for all contour lines is divided into grid units based on a density of the contour lines of the terrain, so as to realize a rapid data retrieval and positioning. Furthermore, according to the device and the method, overlay analysis is performed based on the divided spatial grid units and the elevation points which are extracted based on the contour line data of the terrain, so as to obtain an index database and a set of region of the grid units for which a TIN model is required to be established. A window indexer is constructed for the set of region of the grid units for which the TIN is required to be established, to search for elevation points which may influence the current grid unit in a certain range. Based on this, according to the device and the method, a TIN is constructed only for a region of the current grid unit for which the TIN is required to be established based on the searched elevation points, and a value is assigned to an elevation value of the current grid unit, to obtain a final grid region. Therefore, a terrain boundary can be efficiently extracted from the processed final grid region to generate a buffer zone. The above embodiments of the present disclosure are only exemplary, and the present disclosure is not limited thereto. Those skilled in the art can understand that various changes may be made to the embodiments without departing from the principle and spirit of the present disclosure. The scope of the present disclosure is limited by the claims and an equivalent thereof.

The invention claimed is:

1. A device for extracting a terrain boundary, comprising:
a grid creating module, configured to divide a region to form a regular grid comprising a plurality of grid units; wherein the region is determined based on measured contour line data of a target terrain;
a data analyzing module, configured to assign a first standard value or a second standard value to each grid unit of the plurality of grid units based on the number of elevation points comprised in the grid unit, to form a final grid region, wherein the final grid region is a region comprising all grid units having the first standard value; and
a boundary extracting module, configured to extract a terrain boundary based on the final grid region.

2. The device according to claim 1, wherein for forming the final grid,
the data analyzing module is configured to:
assign the first standard value to each of grid units that comprise at least one elevation point; and
for each of grid units that comprise no elevation point, assign the first standard value or the second standard value to the grid unit, based on elevation point comprised in a predetermined number of grid units which are close to the grid unit.

3. The device according to claim 2, wherein for forming the final grid,
the data analyzing module is configured to:
construct a triangulated irregular network model for each of the grid units that comprise no elevation point, based on the elevation point in the predetermined number of grid units which are close to the grid unit that comprises no elevation point, assign the first standard value to the grid unit in a case that the triangulated irregular network model meets a predetermined condition, and
assign the second standard value to the grid unit in a case that the triangulated irregular network model does not meet the predetermined condition.

4. The device according to claim 3, further comprising:
an elevation point extracting module, configured to extract elevation points based on the measured contour line data and store information of the extracted elevation points, wherein the information of the extracted elevation point comprises longitude, latitude, and an elevation value of the elevation point.

5. The device according to claim 4,
wherein the data analyzing module is configured to traverse the elevation points extracted based on the measured contour line data, and establish and store a spatial index relation between each of the elevation points and the plurality of grid units in the regular grid;
wherein the data analyzing module is configured to calculate a position of the grid unit, in which each of the elevation points is located, in the regular grid based on grid information of the regular grid, to establish and store the spatial index relation.

6. The device according to claim 3, wherein for constructing the triangulated irregular network model:
the data analyzing module is configured to acquire the predetermined number of grid units which are close to the grid unit through a window indexer using the spatial index relation, to construct the triangulated irregular network model using the elevation point in the predetermined number of grid units.

7. The device according to claim 3, wherein for constructing the triangulated irregular network model:
the data analyzing module is configured to construct the triangulated irregular network model using the elevation point in the predetermined number of grid units in a case that the total number of the elevation point comprised in the predetermined number of grid units is greater than or equal to three, and assign the second standard value to the grid unit in a case that that the total number is less than three.

8. The device according to claim 3,
wherein the data analyzing module is configured to determine that the triangulated irregular network model meets the predetermined condition in a case that a central point of the grid unit is located in the triangulated irregular network model; and
the data analyzing module is configured to determine that the triangulated irregular network model does not meet the predetermined condition in a case that the central point of the grid unit is located outside the triangulated irregular network model.

9. The device according to claim 1,
wherein the grid creating module is configured to determine a density of the contour lines based on the measured contour line data, determine a size of the grid unit based on the density of counter lines, and divide the region into a plurality of grid units based on the grid unit with the determined size, to form the regular grid comprising the plurality of grid units.

10. A method for extracting a terrain boundary, comprising:
dividing a region, to form a regular grid comprising a plurality of grid units; wherein the region is determined based on measured contour line data of a target terrain assigning a first standard value or a second standard value to each grid unit of the plurality of grid units based on the number of elevation points comprised in the grid unit, to form a final grid region, wherein the final grid region is a region comprising all grid units having the first standard value; and extracting a terrain boundary based on the final grid region.

11. The method according to claim 10, wherein the step of assigning a first standard value or a second standard value to each grid unit of the plurality of grid units based on the number of elevation points in the grid unit to form a final grid region comprises:

assigning the first standard value to each of grid units that comprise at least one elevation point; and for each of grid units that comprise no elevation point, assigning the first standard value or the second standard value to the grid unit, based on elevation point comprised in a predetermined number of grid units which are close to the grid unit.

12. The method according to claim 11, wherein the step of for each of grid units that comprise no elevation point, assigning the first standard value or the second standard value to the grid unit, based on elevation point comprised in a predetermined number of grid units which are close to the grid unit comprises:

constructing a triangulated irregular network model for each of the grid units that comprise no elevation point, based on the elevation point comprised in the predetermined number of grid units close to the grid unit that comprises no elevation point;

assigning the first standard value to the grid unit in a case that the triangulated irregular network model meets a predetermined condition, and assigning the second standard value to the grid unit in a case that the triangulated irregular network model does not meet the predetermined condition.

13. The method according to claim 12, further comprising:

extracting elevation points based on the measured contour line data, and storing information of the extracted elevation points, wherein the information of the extracted elevation point comprises longitude, latitude, and an elevation value of the elevation point.

14. The method according to claim 13, further comprising:

traversing the elevation points extracted based on the measured contour line data, and establishing and storing a spatial index relation between each of the elevation points and the plurality of grid units in the regular grid;

wherein the step of establishing and storing a spatial index relation between each of the elevation points and the plurality of grid units in the regular grid comprises:

calculating a position of the grid unit, in which each of the elevation points is located, in the regular grid based on grid information of the regular grid, to establish and store the spatial index relation.

15. The method according to claim 12, wherein the step of constructing a triangulated irregular network model comprises:

acquiring the predetermined number of grid units which are close to the grid unit through a window indexer using the spatial index relation, to construct the triangulated irregular network model using the elevation point comprised in the predetermined number of grid units.

16. The method according to claim 12, wherein the step of constructing a triangulated irregular network model comprises:

constructing the triangulated irregular network model using the elevation point comprised in the predetermined number of grid units in a case that the total number of the elevation point comprised in the predetermined number of grid units is greater than or equal to three; and assigning the second standard value to the grid unit in a case that that the total number is less than three.

17. The method according to claim 12, further comprising:

determining that the triangulated irregular network model meets the predetermined condition in a case that a central point of the grid unit is located in the triangulated irregular network model; and determining that the triangulated irregular network model does not meet the predetermined condition in a case that the central point of the grid unit is located outside the triangulated irregular network model.

18. The method according to claim 10, wherein the step of dividing a region which is determined based on measured contour line data of a target terrain to form a regular grid comprising a plurality of grid units comprises:

determining a bounding rectangle of contour lines, which are determined based on the measured contour line data, as the region.

19. The method according to claim 18, wherein the step of dividing a region which is determined based on measured contour line data of a target terrain to form a regular grid comprising a plurality of grid units further comprises:

determining a density of the contour lines based on the measured contour line data;

determining a size of the grid unit based on the density of counter lines; and dividing the region into a plurality of grid units based on the grid unit with the determined size, to form the regular grid comprising the plurality of grid units.

20. A computer readable non-transitory memory medium in which a computer program is stored, wherein the computer program is for executing the method according to claim 10.

* * * * *